US006277540B1

(12) United States Patent
Watkiss

(10) Patent No.: US 6,277,540 B1
(45) Date of Patent: Aug. 21, 2001

(54) HEAT SENSITIVE PLATE PRECURSORS

(75) Inventor: Philip John Watkiss, Leeds (GB)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/424,902

(22) PCT Filed: Jun. 2, 1998

(86) PCT No.: PCT/EP98/03475

§ 371 Date: Feb. 7, 2000

§ 102(e) Date: Feb. 7, 2000

(87) PCT Pub. No.: WO98/55308

PCT Pub. Date: Dec. 10, 1998

(30) Foreign Application Priority Data

Jun. 3, 1997 (GB) .................................................. 9711387

(51) Int. Cl.[7] ................................ G03F 7/07; G03F 7/06; G03F 7/11; G03F 7/36; G03F 7/20

(52) U.S. Cl. .................. 430/273.1; 430/204; 430/276.1; 430/278.1; 430/302; 430/616; 430/964

(58) Field of Search .................................... 430/204, 302, 430/964, 616, 276.1, 273.1, 278.1

(56) References Cited

U.S. PATENT DOCUMENTS 3,314,073 * 4/1967 Becker .
4,567,131 * 1/1986 Watkiss ................................ 430/204
5,401,611 * 3/1995 Edwards et al. ..................... 430/616

FOREIGN PATENT DOCUMENTS

131462 * 1/1985 (EP) .
609941 * 8/1994 (EP) .
628409 * 12/1994 (EP) .
816071 * 1/1998 (EP) .

* cited by examiner

*Primary Examiner*—Richard L. Schilling
(74) *Attorney, Agent, or Firm*—Breiner & Breiner, L.L.C.

(57) ABSTRACT

A lithographic printing plate precursor comprises a grained and anodised aluminium substrate coated with a layer of metallic silver on top of which is applied a composition comprising an oleophilising agent and a proteolytic enzyme. Imagewise exposure of the precursor by means of a high intensity laser beam allows for the direct provision of press ready plates showing excellent start-up and clean-up properties on press and providing high image quality and high printing durability without the requirement for the use of intermediate film and developer chemistry. On exposure of the plate precursor, removal of the metallic layer occurs in the exposed areas.

12 Claims, No Drawings

HEAT SENSITIVE PLATE PRECURSORS

This invention relates to the formation of images directly from electronically composed digital sources and is particularly concerned with the formation of images on lithographic printing plate precursors. More particularly, the invention relates to lithographic printing plate precursors which incorporate an imaging layer comprising metallic silver, and a method of preparing lithographic printing plates which does not require the use of chemical treatments.

Lithographic printing is a process of printing from surfaces which have been prepared in such a way that certain areas are capable of accepting ink (oleophilic areas), whereas other areas will not accept ink (oleophobic areas). The oleophilic areas form the printing areas while the oleophobic areas form the background areas.

Plates for use in lithographic printing processes may be prepared using a photographic material that is made imagewise receptive or repellent to ink upon photo-exposure of the photographic material and subsequent chemical treatment. However, this method of preparation, which is based on photographic processing techniques, involves several steps, and therefore requires a considerable amount of time, effort and expense.

Consequently it has, for many years, been a long term aim in the printing industry to form images directly from an electronically composed digital database, ie by a so-called "computer-to-plate" system. The advantages of such a system over the traditional methods of making printing plates are:

(i) the elimination of costly intermediate silver film and processing chemicals;

(ii) a saving of time; and (iii) the ability to automate the system with consequent reduction in labour costs.

The introduction of laser technology provided the first opportunity to form an image directly on a printing plate precursor by scanning a laser beam across the surface of the precursor and modulating the beam so as to effectively turn it on and off. In this way, radiation sensitive plates comprising a high sensitivity polymer coating have been exposed to laser beams produced by water cooled UV argon-ion lasers and electrophotographic plates having sensitivities stretching into the visible spectral region have been successfully exposed using low powered air-cooled argon-ion, helium-neon and semiconductor laser devices.

Imaging systems are also available which involve a sandwich structure which, on exposure to a heat generating infra-red laser beams undergoes selective (imagewise) delamination and subsequent transfer of materials. Such so-called peel-apart systems are generally used as replacements for silver halide films.

A digital imaging technique has been described in U.S. Pat. No. 4,911,075 whereby a so-called driographic plate which does not require dampening with an aqueous fountain solution to wet the non-image areas during printing is produced by means of a spark discharge. In this case, a plate precursor comprising an ink-repellent coating containing electrically conductive particles coated on a conductive substrate is used and the coating is ablatively removed from the substrate. Unfortunately, however, the ablative spark discharge provides images having relatively poor resolution.

It is known to improve this feature by the use of lasers to obtain high resolution ablation as described, for example, by P E Dyer in "Laser Ablation of Polymers" (Chapter 14 of "Photochemical Processing of Electronic Materials", Academic Press, 1992, p359–385). Until recently, imaging via this method generally involved the use of high power carbon dioxide or excimer lasers. Unfortunately such lasers are not well-suited to printing applications because of their high power consumption and excessive cost, and the requirement for high pressure gas handling systems. Recent developments have, however, led to the availability of more suitable infra-red diode lasers, which are compact, highly efficient and very economical solid state devices. power versions of such lasers, which are capable of delivering up to 3000 $cm^2$, are now commercially available.

Coatings which may be imaged by means of ablation with infra-red radiation have previously been proposed. Thus, for example, a proofing film in which an image is formed by imagewise ablation of a coloured layer on to a receiver sheet is described in PCT Application No. 90/12342. This system is, however, disadvantageous in requiring a physical transfer of material in the imaging step, and such methods tend to give rise to inferior image resolution.

Much superior resolution is obtained by means of the ablation technique described in European Patent No. 649374, wherein a driographic printing plate precursor is imaged digitally by means of an infra-red diode laser or a YAG laser, and the image is formed directly through the elimination of unwanted material. The technique involves exposing a plate precursor, incorporating an infra-red radiation ablatable coating covered with a transparent cover sheet, by directing the beam from an infra-red laser at sequential areas of the coating so that the coating ablates and loses its ink repellancy in those areas to form an image, removing the cover sheet and ablation products, and inking the image.

A heat mode recording material is disclosed in U.S. Pat. No. 4034183 which comprises an anodised aluminium support coated with a hydrophilic layer. On imagewise exposure using a laser, the exposed areas are rendered hydrophobic, and thereby accept ink.

Japanese patent application laid open to public inspection No. 49-117102 (1974) discloses a method for producing printing plates wherein a metal is incorporated in the imaging layer of a printing plate precursor which is imaged by irradiation with a laser beam modulated by electric signals. Typically, the plate precursor comprises a metal base, such as aluminium, coated with a resin film, which is typically nitrocellulose, and on top of which has been provided a thin layer of copper. The resin and metal layers are removed in the laser-struck areas, thereby producing a printing plate. The disadvantage of this system, however, is that two types of laser beam irradiation are required in order to remove firstly the copper (eg by means of an argon-ion laser) and then the resin (eg with a carbon dioxide laser); hence, the necessary equipment is expensive.

Subsequently a method of printing plate production which obviated the requirement for a second laser exposure was disclosed in Japanese patent application laid open to public inspection No. 52-37104 (1977). Thus, a printing plate precursor comprising a support, typically aluminium, an anodic aluminium oxide layer, and a layer of brass, silver, graphite or, preferably, copper is exposed to a laser beam of high energy density in order to render the exposed areas hydrophilic to yield a printing plate. The printing plate precursor is, however, of rather low sensitivity and requires the use of a high energy laser for exposure.

An alternative heat mode recording material for making a lithographic printing plate is disclosed in European Patent No. 609941, which comprises a support having a hydrophilic surface, or provided with a hydrophilic layer, on which is coated a metallic layer, on top of which is a hydrophobic layer having a thickness of less than 50 nm. A lithographic printing plate may be produced from the said material by imagewise exposing to actinic radiation, thereby rendering the exposed areas hydrophilic and repellent to greasy ink.

Conversely, European Patent No. 628409 discloses a heat mode recording material for making a lithographic printing plate which comprises a support and a metallic layer, on top of which is provided a hydrophilic layer having a thickness of less than 50 nm. A lithographic printing plate is produced by imagewise exposing the material to actinic radiation in order to render the exposed areas hydrophobic and receptive to greasy ink.

In each of the two foregoing heat mode recording materials, however, difficulties in printing will be encountered. On exposure of the materials to actinic radiation, the energy is converted to beat in the image areas by interaction with the metallic layer, thereby destroying the hydrophilicity or hydrophobicity—depending on the material employed—of the topmost layer in those areas. Consequently, the surface of the metallic layer becomes exposed, and the success of the printing operation is dependent upon differences in hydrophilicity and oleophilicity between the metallic surface and the hydrophilic or hydrophobic layer, as the case may be. Since the metallic layer functions as the hydrophobic surface in one case, and as the hydrophilic surface in the alternative case, it would be expected that such differences in hydrophilicity and oleophilicity would not be sufficiently clearly defined so as to provide a satisfactory printing surface. Furthermore, when a hydrophilic layer is present, and the metallic surface functions as the oleophilic areas of the plate, image areas will necessarily be printed from the metallic surface; such an arrangement is known to be unsatisfactory, and to result in difficulties in achieving acceptable printing quality.

It is an object of the present invention to provide a lithographic printing plate having excellent printing properties, and a method of making said plate which obviates the requirement for the use of processing developers after exposure.

It is a further object of the present invention to provide a method of preparing a lithographic printing plate which does not require the use of costly intermediate film and relies on direct-to-plate exposure techniques.

It is a still further object of the present invention to provide a method of producing a lithographic printing plate in which a high quality image results from the ablation of a metallic layer from a hydrophilic support, thus providing a high degree of differentiation between hydrophilic and oleophilic areas.

It is known in the art that the degree of differentiation between hydrophilic and oleophilic areas of anodised lithographic printing plates of this type may be enhanced by treatment of the plate surface with a chemical composition designed to promote the ink-receptive properties of the metal, whilst improving the hydrophilic properties of the exposed anodic oxide layer. In particular, EP-A-131462 teaches a method of treating a lithographic printing plate having areas of metallic silver, the method comprising applying a combination of an oleophilising agent and a proteolytic enzyme.

It is, therefore, an additional objective to further enhance the degree of differentiation between hydrophilic and oleophilic areas on the surface of a lithographic printing plate by means of a chemical treatment, in order to ensure good clean-up and start-up on press and high image quality with clean background areas.

It is known from EP-A-131462 to treat an imaged printing plate, in which the image areas are composed of metallic silver, in order to enhance the degree of differentiation between hydrophilic and oleophilic areas. However, the present inventors have found that a lithographic printing plate precursor may be subjected to such a treatment prior to exposure and the effectiveness of the treatment remains undiminished when the precursor is subjected to a heat mode laser exposure designed to remove non-image areas of the coating by ablation. Thus, it is possible to produce a lithographic printing plate precursor which is capable of conversion to a press-ready printing plate simply by heat mode laser exposure, without any requirement for subsequent chemical treatment prior to use on the press, resulting in significant savings being achieved in terms of time and materials and eliminating the requirement for waste treatment and disposal of chemicals.

Consequently, it is a yet further objective of the present invention to provide a lithographic printing plate precursor in which all necessary press start-up materials are applied at the manufacturing stage, prior to shipping to the end user, such that subsequent use of the plate precursor is greatly simplified and imagewise exposure is the only operation required prior to use on the press.

According to a first aspect of the present invention there is provided a lithographic printing plate precursor comprising:

(i) a grained and anodised aluminium substrate, having coated thereon (ii) a layer of metallic silver, on top of which is applied (iii) a composition comprising an oleophilising agent and a proteolytic enzyme.

The substrate employed in the present invention is an aluminium substrate which has been electrochemically grained and anodised on at least one surface in order to enhance its lithographic properties. Optionally, the aluminium may be laminated to other materials, such as paper or various plastics materials, in order to enhance its flexibility, whilst retaining the good dimensional stability associated with aluminium.

The metallic silver layer which is applied to the grained and anodised surface of the aluminium has a thickness which preferably lies in the range of from 20 nm to 200 nm, most preferably from 40 nm to 100 nm.

Various techniques are available for the application of the silver layer to the grained and anodised aluminium substrate, including vapour or vacuum deposition or sputtering. However, the most preferred method for applying the layer involves the treatment of a silver halide photographic material according to the silver salt diffusion transfer process.

In the diffusion transfer process, a silver halide emulsion layer is transformed, by treatment with a so-called silver halide solvent, into soluble silver complex compounds which are then allowed to diffuse into an image receiving layer and are reduced therein by means of a developing agent, generally in the presence of physical development nuclei, to form a metallic silver layer.

Two such systems are available: a two sheet system in which a silver halide emulsion layer is provided on one element and a physical development nuclei layer is provided on a second element, the two elements being placed in contact in the presence of developing agent(s) and silver halide solvent(s) in the presence of an alkaline processing liquid and subsequently peeled apart to provide a metallic silver layer on the second element; and a single sheet system wherein the element is provided with a physical development nuclei layer, a silver halide emulsion layer being provided on top thereof, the element being treated with developing agent(s) and silver halide solvent(s) in the presence of an alkaline processing liquid and the element being washed to remove spent emulsion layer and leave a metallic silver layer which is formed in the layer containing physical development nuclei.

Alternatively, the diffusion transfer process may be used to apply a metallic silver layer by overall exposing a positive working silver halide emulsion layer to form a latent negative image which is then developed in contact with a physical development nuclei layer to form a metallic silver layer. Again, the process may be carried out using either a single sheet or a double sheet system.

The principles of the silver complex diffusion transfer process are fully described in the publication "Photographic Silver Halide Diffusion Processes" by Andre Rott and Edith Weyde, The Focal Press, London and New York, 1972, and further detail may be gleaned by reference thereto.

The composition comprising an oleophilising agent and a proteolytic enzyme is typically applied by means of an aqueous solution containing from 0.1% to 10.0% by weight of enzvme and from 0.5% to 5.0% by weight of oleophilising compound.

Optimum results are achieved when a dry weight of from 0.1 g/m$^2$ to 3.0 g/m$^2$ of these materials is applied, giving a layer having a thickness of from 100 nm to 3000 nm.

Suitable enzymes for use in the composition may include, for example, trypsin, pepsin, ficin, papain or the bacterial proteases or proteinases. Oleophilising compounds may be chosen from those disclosed on pages 105 to 106 of "Photographic Silver Halide Diffusion Processes" by Andre Rott and Edith Weyde, but mercapto compounds and cationic surfactants such as quaternary ammonium compounds are of particular value.

In accordance with a preferred embodiment of the present invention, a desensitising compound is also incorporated in the composition comprising an oleophilising agent and a proteolytic enzyme, in order to desensitise the non-image areas of the printing plate and prevent ink acceptance therein. Suitable desensitising compounds include carbohydrates such as gum arabic, dextrin and inorganic polyphosphates such as sodium hexametaphosphate. Typically, the desensitising compound is present at a level of from 1.0% to 10.0% by weight in the aqueous solution used for application of the composition.

Additionally the composition may also incorporate other components, such as surfactants, preferably non-ionic, anionic or amphoteric surfactants, biocides and pH buffering agents such as citrates, borates or phosphates.

According to a second aspect of the present invention, there is provided a method of preparing a lithographic printing plate, said method comprising:

a) providing a lithographic printing plate precursor as hereinbefore described; and b) imagewise exposing said precursor by means of a high intensity laser beam.

The precursor is imaged by a beam of radiation, preferably from a laser operating in the infra-red region of the spectrum. Examples of suitable infra-red lasers include semiconductor lasers and YAG lasers, for example the Gerber Crescent 42T Platesetter with a 10 W YAG laser outputting at 1064 nm. Exposure to the beam of radiation causes ablation of the metallic layer to occur in the radiation-struck areas.

Following exposure, no further treatment of the printing plate is required prior to its use on the press.

The method of the present invention thereby provides press-ready plates directly on exposure. Said plates show excellent start-up and clean-up properties on press and provide high image quality and high durability on press without the requirement for the use of costly intermediate film, developing and processing chemicals, and the attendant inconvenience resulting from the use of these materials.

The following example is illustrative of the invention, without placing any limit on the scope thereof:

EXAMPLE

A commercially available Howson SILVERLITH® SDB printing plate, available from DuPont Printing and Publishing, was processed without exposure through an automatic processor by means of the diffusion transfer reversal method, in accordance with the recommendation of the manufacturer, but the final stage of applying a specified finishing gum was omitted. The resulting printing plate precursor comprised a grained and anodised aluminium substrate on the anodised surface of which was coated a layer of silver.

Eight further printing plate precursors were prepared in identical fashion, except that aqueous finishing solutions were applied, by means of the finishing section of the processor, to provide an overlayer comprising approximately 0.5 g/m$^2$ of finishing chemicals of top of the silver layer.

Thus, nine different printing plate precursors were obtained, having finishing layers derived from the following finisher compositions:

| Sample | Finisher Composition |
|---|---|
| A | None |
| B | 5% sodium hexametaphosphate + 2% Triton X100 ® + 2% Alcalase ® + 5% polyethylene glycol 200 + 0.5% 1-phenyl-5-mercapto-1,2,3,4-tetrazole. |
| C | 5% sodium hexametaphosphate + 2% Triton X100 ® + 2% Alcalase ® + 5% polyethylene glycol 200 + 0.5% cetyltrimethylammonium bromide. |
| D | 5% sodium hexametaphosphate + 2% Triton X100 ® + 5% polyethylene glycol 200. |
| E | 5% sodium hexametaphosphate + 2% Triton X100 ® + 2% Alcalase ® + 5% polyethylene glycol 200. |
| F | 5% sodium hexametaphosphate + 2% Triton X100 ® + 5% polyethylene glycol 200 + 0.5% 1-phenyl-5-mercapto-1,2,3,4-tetrazole. |
| G | 2% gum arabic + 2% Triton X100 ® + 2% Alcalase ® + 5% polyethylene glycol 200 + 0.5% 1-phenyl-5-mercapto-1,2,3,4-tetrazole. |
| H | 10% dextrin + 2% Triton X100 ® + 2% Alcalase ® + 5% polyethylene glycol 200 + 0.5% 1-phenyl-5-mercapto-1,2,3,4-tetrazole. |
| I | 5% sodium hexametaphosphate + 2% Triton X100 ® + 2% Alcalase ® + 5% polyethylene glycol 200 + 0.2% 1-octyl-5-mercapto-1,2,3,4-tetrazole |

Triton X100 ® is a commercial non-ionic surfactant.
Alcalase ® is a commercial proteinase.
All percentages are expressed on a weight/weight basis.

The printing plate precursors A to I were separately loaded on to a Gerber Crescent 42T internal drum Laser Platesetter fitted with an extraction system comprising a curved nozzle about 1 cm from the plate surface, an air suction pump and a 0.3 $\mu$m HEPA filter for removal of ablation debris and imagewise exposed to a 10OW YAG laser outputting at a wavelength of 1064 n/m and peak power density of 6.5 MW/cm$^2$. After storage for 4 weeks at ambient temperature of 20° C. to 25° C., and relative humidity between 40% and 60%, sections of the nine plates were mounted on a Drent Web Offset printing press and prints were produced.

For each sample of plate, the number of copies produced before a good quality copy was achieved was noted at the commencement of the run. In this regard, two criteria were applied: firstly, the number of copies required before the hydrophilic background was cleaned of ink was recorded, and subsequently the number of copies produced before the silver image took ink was also observed. The results obtained are shown in Table 1, and illustrate the advantages provided by the invention.

TABLE 1

| Plate Sample | Clean-up | Ink Receptivity |
|---|---|---|
| A | >200 | >500 |
| B | 10 | 15 |
| C | 10 | 30 |
| D | 10 | >400 |
| E | 10 | >350 |
| F | 10 | >400 |
| G | 30 | 10 |
| H | 25 | 20 |
| I | 10 | 20 |
| Sample A treated with solution B after exposure | 10 | 5 |

What is claimed is:

1. A lithographic printing plate precursor comprising:

(i) a grained and anodised aluminium substrate having coated thereon (ii) a layer of metallic silver on top of which is applied (iii) a composition comprising an oleophilising agent and a proteolytic enzyme.

2. A lithographic printing plate precursor as defined in claim 1 wherein said metallic silver layer is applied by means of the silver salt diffusion transfer process.

3. A lithographic printing plate precursor as defined in claim 1 or 2 wherein said metallic silver layer has a thickness of from 20 nm to 200 nm.

4. A lithographic printing plate precursor as defined in claim 1 wherein said composition comprising an oleophilising agent and a proteolytic enzyme comprises an aqueous solution containing from 0.1% to 10.0% by weight of enzyme and from 0.5% to 5.0% by weight of oleophilising compound.

5. A lithographic printing plate precursor as defined in claim 1 wherein said composition comprising an oleophilising agent and a proteolytic enzyme is applied on top of said metallic silver layer to give a layer having a dry coating weight of from 0.1 $g/m^2$ to 3.0 $g/m^2$ and a thickness of from 100 nm to 3000 nm.

6. A lithographic printing plate precursor as defined in claim 1 wherein said proteolytic enzyme comprises trypsin, pepsin, ficin, papain or a bacterial protease or proteinase.

7. A lithographic printing plate precursor as defined in claim 1 wherein said oleophilising compound comprises a mercapto compound or a cationic surfactant.

8. A lithographic printing plate precursor as defined in claim 7 wherein said cationic surfactant comprises a quaternary ammonium compound.

9. A lithographic printing plate precursor as defined in claim 1 wherein said composition comprising an oleophilising agent and a proteolytic enzyme additionally includes a desensitising compound.

10. A lithographic printing plate precursor as defined in claim 9 wherein said desensitising compound comprises a carbohydrate or an inorganic polyphosphate.

11. A lithographic printing plate precursor as defined in claim 10 wherein said carbohydrate is gum arabic or dextrin.

12. A method of preparing a lithographic printing plate, said method comprising:

(a) providing a lithographic printing plate precursor as defined in any of claims 1–11; and (b) imagewise exposing said precursor by means of a high intensity laser beam.

* * * * *